Aug. 18, 1964 D. J. QUINN III 3,144,704

METHOD OF MAKING COUPLINGS TO SUPER-CONDUCTOR CIRCUITS

Filed July 2, 1962 2 Sheets-Sheet 1

INVENTOR.
DANIEL J. QUINN III

BY [signature]

ATTORNEY

METHOD OF MAKING COUPLINGS TO SUPER-CONDUCTOR CIRCUITS

Filed July 2, 1962 2 Sheets-Sheet 2

United States Patent Office 3,144,704

Patented Aug. 18, 1964

3,144,704

METHOD OF MAKING COUPLINGS TO SUPER-CONDUCTOR CIRCUITS

Daniel J. Quinn III, Chappaqua, N.Y., assignor to International Business Machines Corporation, New York, N.Y., a corporation of New York Filed July 2, 1962, Ser. No. 206,623
8 Claims. (Cl. 29—155.5)

The present invention relates to a method for making connections to superconducting thin films and to the formation of a metal-insulator interface across which such thin films may be successively deposited.

The problem of making reliable and structurally strong connections to superconducting thin films mounted on substrates has long been a vexing one to practitioners in the superconductor field. The two factors which greatly aggravate the problems of making reliable connections are the fact that superconductors inherently must undergo very severe heat cycling, for example, from room temperature down to temperatures very closely approaching absolute zero and that the thickness of the films themselves is on the order of from 5000 to 10000 angstroms, thus making it particularly difficult to make an electrical connection by normal methods. The superconductive thin films are in fact so thin as to be virtually transparent. Thus, the problem of even the slightest differential expansion during heat cycling is far more critical than in any other known technology such as, for example, printed circuits. Fabrication techniques which are very satisfactory for printed circuits are completely inoperative when applied in the superconductor area.

In the early technology of superconductors the superconductive ground planes and the circuits themselves were placed on glass slides or substrates. Since glass is an excellent insulator, the ground plane was vapor deposited directly on the glass and then a very thin layer of an insulating medium was deposited on top of the ground plane and then the actual superconductive elements such as cryotrons and the like deposited on top of the insulative layer. Electrical connections were made to such devices by conventional methods involving the plating of strip lines formed of super-conductor material on the surface of the insulating material and continuing same across the surface of the glass to a point near the edge where a piece of metallic foil such as tin or the like was attached. The nature of the glass was such that the foil tabs or "lands," as they are known in the art, could be made to adhere strongly to the surface of the glass and appropriate connections made to such lands. However, it has now been found that superior results can be obtained from a superconductive device if the substrate is made of a metal rather than glass due to the far superior heat conducting properties of the metal. However, use of the metal substrate requires the depositing of a thin layer of insulating material on the surface of the metal substrate even before the ground plane is vapor deposited thereon. Thus, when the strip line connections are made to the cryogenic circuits in turn mounted over the ground plane they must be electrically connected to the foil lands as before. However, due to the nature of the insulating layers which may be silicon monoxide (SiO), polyvinyl chloride (P.V.C.) and the like, it has been found that there is no method for satisfactorily affixing the lands thereto to insure adherence through several cooling cycles. These tabs or lands tend to peel off or otherwise interrupt the connection to their respective strip lines. It is also not possible to make direct connections of any sort to the vapor deposited strip lines as they are likewise only several thousand angstroms in thickness and absolutely preclude the making of any sort of a soldered or other physical connection thereto as such attempt will result in the destruction of such strip lines.

It should be noted that in the superconductor art, the strip lines as well as the active devices are conventionally made of superconductor material since $I^2R$ losses in the conductors cause considerable heating and resultant malfunctions. Thus, throughout the remainder of the specification whenever the term "strip line" is used, it is to be understood that such strip line is made of a superconductor material.

It has now been found that successful connections may be made to strip lines deposited on the surface of a metallic cryogenic substrate by potting a suitable wire within a hole passing through the substrate on which the strip line may be vapor deposited on one side and to which suitable electrical connections may be made by soldering on the opposite side from the strip line. By choosing a compound that has substantially the same coefficient of thermal expansion as that of the particular metal substrate such strip lines may be vapor deposited directly over the boundary between the potting compound and the substrate without danger of fracture due to differential expansion upon heat cycling.

A similar problem exists when trying to make what is known in the art as a Garwin transformer, such transformer being more fully set forth and described in copending application No. 132,961, filed August 21, 1961, of Richard L. Garwin, entitled "Interplane Coupling Among Cryogenic Circuits." Such transformers require that no conductive metal be adjacent the area where the coupling is to take place. While it was known that a non-metallic area is needed in both the ground plane and the substrate, no way of forming such an area in a metallic ground plane over which superconductor strip lines could be successfully deposited and operated was known.

It has now been found that such a transformer can be made using the same insulating potting compound as that set forth above. A hole is drilled completely through the substrate under the area where the coupling is to occur and said hole filled with the potting compound and cured and the transformer windings directly vapor deposited across said material.

It is accordingly a primary object of the present invention to provide a superconductive ground plane and metallic substrate structure which allows the vapor deposition of a superconducting thin film over the interface between the metallic substrate and an insulating material embedded therein.

It is a further object of the invention to provide a method for making satisfactory electrical contacts to superconductor circuits mounted on metallic substrates.

It is a still further object of the present invention to provide a method of making a Garwin superconductive transformer on a metal substrate.

It is yet another object of the invention to provide a method for making a potted solder contact to a superconductor circuit mounted on one side of the metal substrate.

The foregoing and other objects, features and advantages of the invention will be apparent from the following more particular description of preferred embodiments of the invention, as illustrated in the accompanying drawings.

age during the soldering operation when appropriate leads are affixed thereto.

The insulating or potting compound used in the present invention must meet rigorous specifications since it must have a coefficient of thermal expansion sufficiently close to that of the metal substrate, usually aluminum, that no appreciable distortion occurs at the interface when the device is cooled to liquid helium temperatures. Also, the material must be such that it will not "degas" or throw off gaseous vapors during the high vacuums encountered during the vacuum deposition of both the superconductive elements and the connecting strip lines.

The epoxy resins most suitable for use with the present invention are of the liquid epoxy type such as derived from the polycondensation of bisphenol A and epichlorohydrin having the general formula:

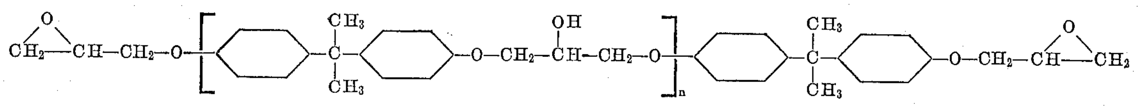

Figure 8:
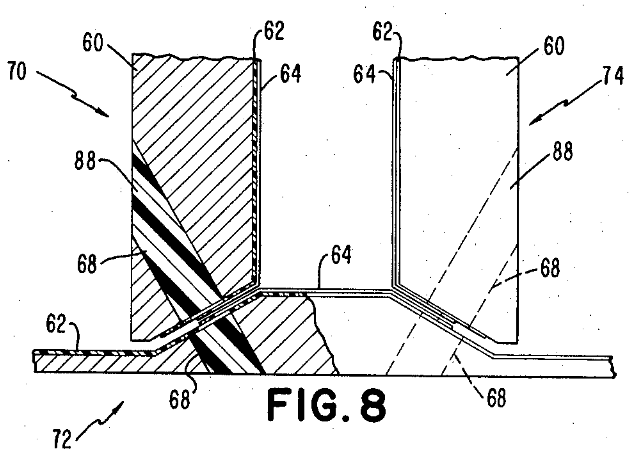

FIGURE 8 is a view in section of a Garwin transformer utilized to link two circuit blocks embodying the present invention.

Figure 9:
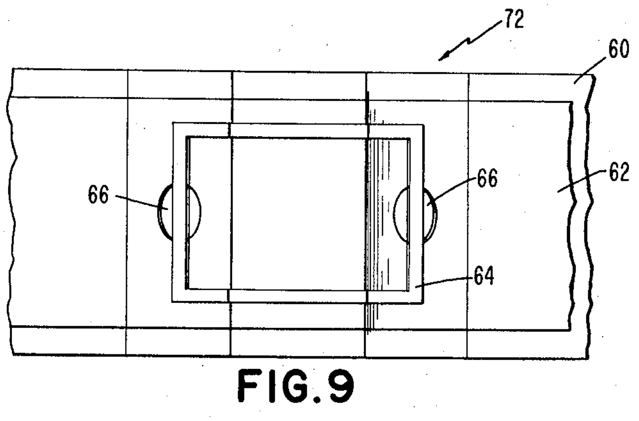

FIGURE 9 is a plan view of the connecting link of the Garwin transformer of FIGURE 8.

The objects of the present invention are accomplished in general by forming a desired hole in a metal substrate, filling said hole with an insulating compound having a substantially identical coefficient of thermal expansion as the metal of the substrate, polishing the area to form a planar surface across the interface between the insulating material and the metal, applying a thin insulating coating to the surface of the metal, and depositing desired conductors directly on the insulative coating across the interface.

A very superior connection can be made to strip lines located on the face of a superconductor ground plane and metal substrate by drilling a hole completely through said substrate and potting a suitable conductor in said hole with the insulating material, grinding said surface smooth as set forth above and vapor depositing the strip line so that it makes contact with the conductor located in the center of the hole, and making electrical connections to external circuitry by soldering to the other end of the conductor which is left protruding from the opposite side of the substrate from the ground plane and strip lines.

A Garwin superconductor transformer is constructed according to the invention by drilling a hole through the substrate underneath the area where the energy transfer or magnetic coupling is to occur and filling the hole with the insulating material, polishing said area to form a smooth planar surface and depositing the strip line which is to form one of the windings of said transformer directly over said hole. Then two such substrates are brought to desired spacing and form the transformer.

According to the principles of the present invention, the use of a metal substrate for superconductor circuits becomes feasible since its provides a satisfactory method for making electrical contact to the strip lines mounted on said substrate. As stated previously, the usual metal foil tabs or lands mounted directly on glass substrates are not practical for use with metal substrates as the insulating layer deposited on the surface of the substrate which is necessary to insulate the individual lands therefrom prohibits said land from making a sufficiently strong physical bond with the substrate and the insulating layer so that when a solder connection is made or when the device is lowered to superconductive temperatures the land quite often peels off or otherwise is caused to break the contact with its strip line connector.

The present invention in one aspect thereof obviates the use of such lands and in effect provides for an improved contact arrangement as the contacts are made on the opposite side of the substrate from the superconductor circuits and therefore removes them from any possible damwhere $n$ varies between 1 and 10. It is preferred that the molecular weight of the resin be less than 1,000 for best results, with a molecular weight of about 630 as optimum. The preferred curing agents for practicing the invention are chosen from known aromatic amine hardeners such as (MPD) meta-phenylenediamine. The proportions of curing agent to resin is not overly critical. In one example, 8.5 parts of meta-phenylenediamine to one hundred parts of resin by weight were used.

The use of a filler material is critical in practicing the invention. A filler suitable for use which matches the coefficient of thermal expansion of the filled epoxy to the aluminum substrate has been found to be alumina ($Al_2O_3$) with usual trace impurities. While the above filler optimizes the invention, other fillers and mixtures thereof could be used as long as the resultant over-all coefficient of thermal expansion of the filler and resin closely match that of the substrate. The filler powder is introduced into the liquid resin prior to introduction of the hardener. The particles size of the filler is rather important. An upper particle size limit exists on the order of about 40 microns and the lower limit is defined only by the desired workability of the epoxy as regards mixing and molding.

The total quantity of filler material used with a given resin is open to considerable breadth. In the above example, the quantity of alumina filler was 67 percent by weight. However, this percentage could vary between 50 and 86 percent by weight with useful results.

Figure 1:
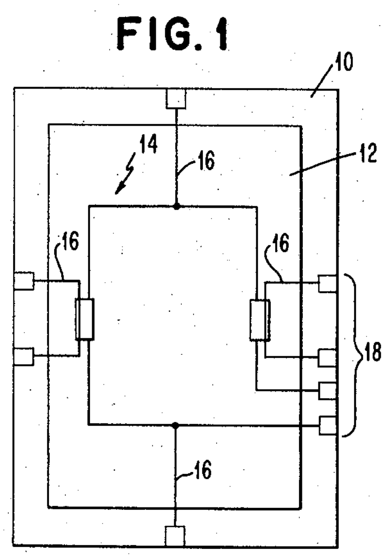
FIGURE 1 is a plan view of a prior art superconductor circuit card having a superconductor flip-flop circuit vapor deposited thereon with conventional strip line conductors and foil terminals or lands.

Referring now to the drawings, FIGURE 1 shows a prior art superconductor flip-flop circuit mounted upon a conventional glass substrate 10 having a ground plane 12 vapor deposited thereon and the superconductive circuit, indicated generally at 14, vapor deposited over the ground plane after a suitable insulating layer has been deposited therebetween. Strip lines 16 are deposited in turn and make the conventional connections to the individual superconductor elements and are brought out to the foil tabs or lands 18 to which suitable electrical connections may be made. It is characteristic of the glass substrate that the metal foil tabs or lands can be deposited thereon with a satisfactory physical bond to withstand both heat cycling and soldering necessary to form such electrical connections.

Figure 2:
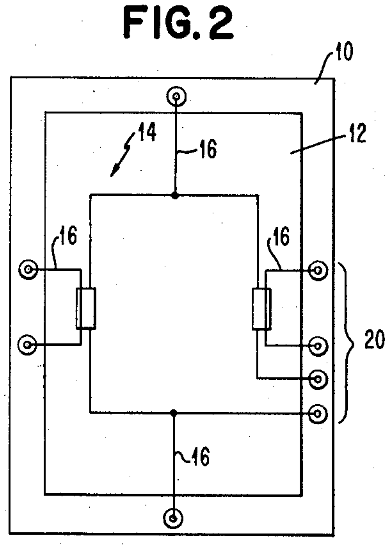
PRIOR ART FIG. 2
FIGURE 2 is a plan view of a superconductor flip-flop circuit card similar to FIGURE 1, illustrating how connections are made to the superconductor circuits vapor deposited on the face of the card according to the present invention.

FIGURE 2 shows an identical superconductor circuit to that of FIGURE 1, and the same reference numerals are used to designate similar portions thereof. However, in the apparatus of FIGURE 2, the substrate 10 is constructed of metal, preferably aluminum, rather than glass and the metal is first coated with an over-all insulative layer such as silicon monoxide or polyvinyl chloride before the ground plane and subsequent circuits are deposited thereon.

This figure illustrates the use of a novel connector constructed in accordance with the teachings of the present invention to replace the foil connectors or lands 18 of the prior art as shown in FIGURE 1. The use of this type of connector makes metal substrates practical with their attendant improved operation for cooling to and maintaining the temperature of the cryogenic circuits at desired operating levels.

Figure 3:
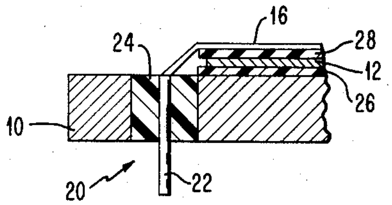
FIGURE 3 is a cross-section taken through a circuit card such as shown in FIGURE 2, illustrating the specific structural details of the connector sub-assembly.

FIGURE 3 is an enlarged sectional view of the connector 20 shown in FIGURE 2.

Figure 4:
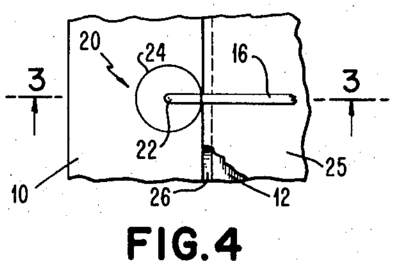
FIGURE 4 is a plan view of the connector shown in FIGURE 3.

FIGURE 4 is an enlarged plan view of the connector 20 of FIGURE 3.

FIGURES 3 and 4 illustrate the details of a connector utilized to make a connection to a conductive strip line 16 located on one side of a metallic substrate 10 and a solder terminal on the other side of said substrate. The figures illustrate the relative locations of the substrate 10, the insulative layer 26 located on the substrate, ground plane 12 in turn deposited over the insulative layer 26 and a second insulative layer 28 on which the cryotron and the like active elements as well as the strip lines 16 are in turn deposited. The connector 20 comprises the epoxy resin potting compound 24 and a through connecting wire or pin 22 preferably made of lead or tin. It should be noted that the dimensions of the insulative layers, the ground plane and the strip lines is very greatly exaggerated for purposes of illustration and that each of these elements is in effect only several thousand angstroms thick and that when the connection is made to the terminal wire 22 by vapor deposition of the strip line 16 on the surface of the device there is actually no apparent angle where the strip line passes over the edge of the various insulative layers and the ground plane.

A significant problem in designing the instant connector was to find an insulative compound to be used as the potting agent 24 which had the same coefficient of thermal expansion as the metal substrate 10 so that at the area where the strip line 16 passed across the interface between these two it was not broken due to differential expansion when the device was cooled to superconductive temperatures and then raised back up to room temperature. It has been found that an aromatic amine cured liquid epoxy resin as set forth above filled with approximately 67 percent by weight of a predominantly aluminum oxide powder substantially matches the thermal coefficient of expansion of aluminum so that strip lines can be successfully deposited over the interface between such insulative material and the aluminum and no break or deformation will occur during the necessary heat cycling of such a device when used in cryogenic applications.

A connector of the type disclosed in FIGURES 3 and 4 is preferably made by first drilling a desired hole in the aluminum substrate 10, coating the wire 22 with the liquid resin 24 so that a sufficient thickness will be built up to still allow said coated wire to be inserted into the hole, allowing this first coating to dry, applying a second coat of liquid resin and inserting the assembly in the hole provided in the substrate. The assembly is then allowed to dry and placed in a curing oven for proper cure of the resin 24. Next, the device is removed from the oven and one side of the substrate is polished to a very high degree such that the surface of the substrate, the resin 24 and the connecting wire 22 form an extremely smooth planar surface. Next, the insulative layer 26 and the ground plane 12 are vapor deposited upon the substrate by conventional methods and the second insulative layer 28 is deposited on top of the ground plane and stopped at or just over the edge of the connector 20 or at least so that the upper surface of the wire 22 is left exposed. Finally, the active cryogenic elements, such as the cryotrons and the strip lines 16, are deposited on the assembly and the strip lines 16 masked so that they are brought out to the edge of the device and make direct contact to the exposed surface of wire 22. Connections to external circuits or to other substrates may then conveniently be made by soldering or socket and pin connections to the opposite end of the wire 22 on the opposite side of the substrate. Metal substrate cryogenic circuit boards have been made according to the teachings of the present invention and have operated very satisfactorily with virtually no strip line failures due to differential expansion of the substrate 10 and the connector assembly 20. Additionally, making solder connections to the opposite surface of the substrate to the wire 22 is greatly simplified and causes almost no failures of the strip lines due to the heat of soldering.

Figure 5:
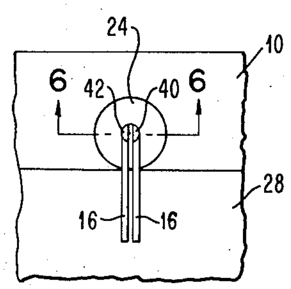
FIGURE 5 is a cross-section taken through a substrate for an A.C. terminal wherein two leads are brought through a simple connector structure.
Figure 6:
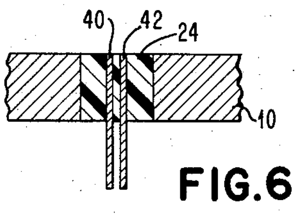
FIGURE 6 is a plan view showing the connector of FIGURE 5.

FIGURES 5 and 6 illustrate another embodiment of the invention wherein an A.C. connection is made through a very similar connector to that of FIGURES 3 and 4. In this embodiment the wire is composed of two parts 40 and 42 conveniently shown as semicircular in cross-section and separated by the material 24 to provide electrical insulation therebetween. Such a connector can be used as a simple double connection to strip lines on the surface of the device or by suitably shaping and spacing the two wires 42 and 44 could even be used in microwave applications. The A.C. connector is made in much the same way as the single connector of FIGURE 3 except that a piece of insulating material 44 may be conveniently inserted between the two connectors before they are initially dipped into the resin 24, alternatively, each of the wires could be pre-dipped in the resin and then brought together for a second application of the resin before insertion into the hole provided in the substrate. In this case, the resin itself forms the insulation between the two wires.

Figure 7:
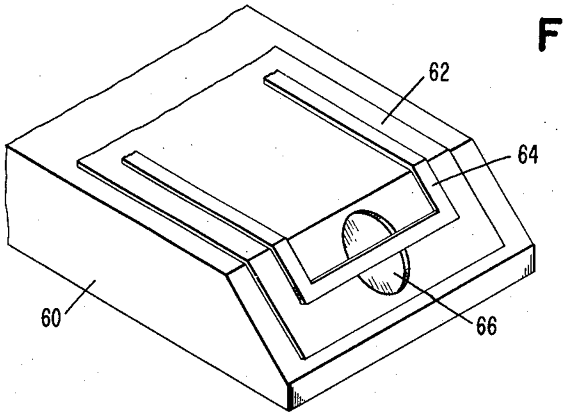
FIGURE 7 is a perspective view showing the details of one of the windings and the support therefor of a Garwin transformer.

FIGURES 7, 8 and 9 show the structural details of what is known in the cryogenic art as a Garwin transformer. The operation and design of such a transformer are set forth in much greater detail in co-pending application No. 132,961 of Richard L. Garwin, filed August 21, 1961, entitled "Inter-Plane Coupling Among Cryogenic Circuits." Briefly, such a transformer requires that a portion of the shielding ground plane 60 be removed to prevent the formation of a conductor image which forms in the ground plane adjacent said conductor. The reasons for this occurrence are extremely involved and reference is made to the above identified co-pending application for a detailed description thereof. The net effect of this conductor image is to prevent magnetic coupling between two wires or windings located adjacent one another when such windings have a ground plane or other conductive element adjacent thereto. The effect is avoided in the Garwin transformer by masking an area where the magnetic coupling is desired and deleting the ground plane from this area during the vapor deposition process. This is satisfactory where the device is laid down upon a glass or similar insulative substrate, however, when it is attempted to use a metal substrate, for example aluminum, the metal of the substrate acts in the same manner as the ground plane to form a virtual conductor image like the ground plane itself. Hence, it has been found necessary to remove a portion of the metal substrate under the area where magnetic coupling is to occur. Since the conductors or windings of such a superconductive transformer are laid down by a vapor deposition process, it is necessary for any hole made in the metal substrate to be filled with some sort of suitable material which will adequately support said strip lines when it is vapor deposited upon the substrate. The material which fills the hole in the substrate must have the same coefficient of thermal expansion as the substrate to prevent differential expansion or contraction and hence distortion at the interface between the filler material and the substrate as such distortion would cause the transformer winding or strip line to break in the same manner as set forth in discussing the above connector. Successful Garwin transformers have been made according to the invention utilizing the same class of filled epoxy resins set forth above, deposited in the hole which is drilled in the metal substrate beneath the area in which magnetic induction is to occur.

FIGURE 7 shows a single input or output winding of a typical Garwin transformer configuration as shown in FIGURE 8, wherein the metal substrate is designated at 60, the ground plane by 62 and the transformer winding as 64. Aperture 66 is provided in the ground plane 62 adjacent that part of the winding 64 wherein an inductive magnetic effect is desired.

FIGURE 8, which is a side view partly in section of a complete Garwin transformer, comprises an input element 70, a connective loop 72 and an output element 74, each of the input, output elements 70 and 74 are identical to the device disclosed in FIGURE 7.

A plan view of the connective loop element 72 is shown in FIGURE 9, wherein the strip line loop element or conductor is again designated by numeral 64 and the apertures in the ground plane at both the input and output coupling areas are again designated by the numbers 66. Referring again to FIGURE 8, it may be seen that two holes filled with a non-conductive material designated by numerals 88 pass from element 70 down through element 72 and in the second instance through element 74 and down through element 72. These holes 88 in the metal substrates are filled with an epoxy resin containing a filler material of the same type as set forth previously in the specification. These filled areas in the metal substrates lie directly under the apertures 66 in the ground planes of elements 70, 72 and 74 so that there is no electrically conductive material in the area under any of the windings where it is desired for the transformer effect to occur, thus, there will be magnetic coupling between the respective windings of the members 70, 72 and 74.

As in the previous embodiment of the invention such a substrate is prepared by first drilling a hole in the substrate in the desired position and in this instance merely filling the hole with the resin curing the member in an appropriate manner and polishing the surface over which the ground plane and strip line conductors are to be deposited so that an extremely continuous smooth surface will be present for the vapor deposition of the ground plane and transformer windings or conductors. It should be noted that in the drawings of FIGURES 7, 8 and 9, the various insulative layers between the metal substrate and the ground plane, and between the ground plane and the strip line conductors have not been shown for purposes of clarity. However, such would obviously be necessary to suitably insulate the various members of the device from each other as is well known in the art.

Garwin transformers laid down on metal substrates can now be successfully built utilizing the present invention and will withstand any number of heat cycles to superconductive temperatures without a break in the conductor or winding at the interface between the insulative filler material and the holes 88 in the substrates and the substrates themselves.

There has thus been disclosed a method for making a composite superconductor substrate having a metal-insulator interface over which strip lines can be successfully vapor deposited and wherein said strip lines will not be broken due to differential expansion at said interface when the device is cooled to superconductive temperatures. Connectors and other superconductor structures made in accordance with the present invention not only allow metal substrates to be successfully used with the superconductor devices but also remove the soldering operation from the vicinity of the cryogenic circuits and thus from possible damage to the circuits by the soldering operation. Thus, the invention not only makes feasible a structure not previously possible but also greatly improves the contact itself over what is known in the prior art even with glass substrates.

While the invention has been particularly shown and described with reference to preferred embodiments thereof, it will be understood by those skilled in the art that various changes in form and details may be made therein without departing from the spirit and scope of the invention.

What is claimed is:

1. A method for making an electrical connection to a superconductor circuit mounted on a first side of a metal substrate which comprises
   (*a*) forming a desired hole in the metal substrate and filling said hole with a filled plastic resin having a substantially identical coefficient of thermal expansion as the metal of the substrate,
   (*b*) locating a conductive element within and passing through said hole separated from contact with the sides thereof by said resin,
   (*c*) polishing a first side of the composite structure including plastic resin, the conductive element, and the substrate to form a planar surface across the interface therebetween,
   (*d*) applying a thin insulating coating to desired areas of the polished surface of the metal substrate,
   (*e*) depositing desired surface conductors on said insulating coating and said plastic resin to make direct electrical connection with the conducting element within said hole.

2. A method as set forth in claim 1, wherein said plastic resin is a liquid epoxy resin cured with an aromatic amine hardener.

3. A method as set forth in claim 1 wherein a superconductive ground plane and a second insulating coating are applied between said first insulating coating and said surface conductors comprising the steps of:
   (*a*) masking at least the surface of the composite structure containing the plastic resin,
   (*b*) depositing a superconductive ground plane over the first insulating coating,
   (*c*) depositing a second insulating coating over the ground plane,
   (*d*) removing the mask, and
   (*e*) depositing surface conductors over the second insulating coating and the plastic resin to make electrical contact with the conducting element within said hole.

4. A method for making an electrical connection to a strip line mounted on one side of a superconductive ground plane and a metal substrate which comprises
   (*a*) forming a hole in said substrate,
   (*b*) potting a suitable conductor in said hole with a plastic resin filled with an insulative powder, said filled resin having a coefficient of thermal expansion substantially equal to that of the metal substrate, said conductor being completely insulated from the walls of said hole, one end of said conductor being substantially flush with the substrate and the opposite end protruding from the substrate,
   (*c*) polishing the composite surface comprising one side of the substrate, the resin and the one end of the potted conductor smooth,
   (*d*) vapor depositing an insulative layer on said one face of the substrate, but leaving the conductor exposed,
   (*e*) vapor depositing a superconductive ground plane on the first insulating layer,
   (*f*) vapor depositing a second insulating layer over the ground plane,
   (*g*) vapor depositing a desired strip line over the second insulating layer, the plastic resin potting material and the conductor so that said strip line makes direct electrical contact with one end of said conductor passing through the hole in the substrate, and
   (*h*) making an electrical connection to the opposite end of the conductor which protrudes from the other face of the substrate.

5. A method as set forth in claim 4 including
   (*a*) potting a twin pair conductor in the hole, (b) separating one conductor from the other within said hole by an insulative medium having substantially the same co-efficient of thermal expansion as said filled plastic resin, (c) making separate strip line connections to each conductor on the polished surface of the substrate.

6. A method as set forth in claim 4, wherein the filled plastic resin is a liquid epoxy derived from the polycondensation of bisphenol A and epichlorohydrin cured with the aromatic amine meta-phenylene diamine and the filler is a comminuted alumina ($Al_2O_3$) powder not exceeding approximately 40 microns in size and comprising approximately 67 percent by weight of the filled resin.

7. A method of making an active element of a superconductor transformer which comprises (a) drilling a hole through a metal substrate in the area where it is desired for magnetic coupling to occur in the transformer, (b) filling said hole with a filled plastic resin insulating material having substantially the same coefficient of thermal expansion as that of the metal, (c) polishing one surface of the composite structure formed by the metal substrate and the plastic resin insulating material to form a smooth planar surface, (d) depositing an insulative layer on the metal portion of the polished surface of the composite structure and (e) depositing a strip line on said insulative layer and polished surface of said plastic resin insulative material within the hole in the substrate.

8. A method as set forth in claim 7, wherein the plastic resin is a liquid epoxy derived from the polycondensation of bisphenol A and epichlorohydrin and cured with an aromatic amine hardener, said resin being filled with approximately 67 percent by weight of a comminuted alumina ($Al_2O_3$) powder before curing.

References Cited in the file of this patent

UNITED STATES PATENTS 3,077,511 Bohrer et al. ------------ Feb. 12, 1963